(12) United States Patent
Funabe

(10) Patent No.: US 12,546,665 B2
(45) Date of Patent: Feb. 10, 2026

(54) OVERHEAD PROTECTION CIRCUIT

(71) Applicants: Kabushiki Kaisha Toshiba, Tokyo (JP); Toshiba Electronic Devices & Storage Corporation, Tokyo (JP)

(72) Inventor: Shiho Funabe, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 317 days.

(21) Appl. No.: 18/113,546

(22) Filed: Feb. 23, 2023

(65) Prior Publication Data
US 2024/0044718 A1    Feb. 8, 2024

(30) Foreign Application Priority Data
Aug. 2, 2022    (JP) .................. 2022-123275

(51) Int. Cl.
*G01K 7/01* (2006.01)
*G05F 1/10* (2006.01)
(Continued)

(52) U.S. Cl.
CPC ................. *G01K 7/01* (2013.01); *G05F 1/10* (2013.01); *H03K 3/02337* (2013.01); *H03K 17/08* (2013.01); *H03K 2017/0806* (2013.01)

(58) Field of Classification Search
CPC ........ G01K 7/01; G05F 1/10; H03K 3/02337; H03K 17/08; H03K 2017/0806; H03K 17/0822; H02H 7/20; H02H 5/047
See application file for complete search history.

(56) References Cited

U.S. PATENT DOCUMENTS 7,088,565 B2 *  8/2006  Watanabe .......... H03K 17/0822
                                                       361/103
8,325,451 B2 * 12/2012  Mitsuda ............. H03K 17/0822
                                                       361/93.1
(Continued)

FOREIGN PATENT DOCUMENTS

JP    H06-332555 A    12/1994
JP    H08-036430 A     2/1996
(Continued)

OTHER PUBLICATIONS

Office Action issued in Japanese Patent Application No. 2022-123275 dated Aug. 5, 2025 in 12 pages.

*Primary Examiner* — Thienvu V Tran
*Assistant Examiner* — Muaamar Qahtan Al-Taweel
(74) *Attorney, Agent, or Firm* — Knobbe, Martens, Olson & Bear, LLP

(57) ABSTRACT

According to an embodiment, an overheat protection circuit includes a reference voltage generation circuit, a constant current source, a second voltage generation circuitry, an output current detection circuit, and a blocking controller. The output current detection circuit generates a third current by subtracting the second current from the first current, and decreases the second current based on the third current as an output current generated by an output circuitry increases, the third current being proportional to the output current. The blocking controller compares the first and second voltages with each other, and generates a blocking control signal to block generation of the output current when the first voltage is higher than the second voltage. An overheat detection temperature drops as the second voltage drops, and detection of the overheat detection temperature is hastened as the output current increases.

6 Claims, 12 Drawing Sheets

(51) Int. Cl.
  *H03K 3/0233* (2006.01)
  *H03K 17/08* (2006.01)

(56) References Cited

U.S. PATENT DOCUMENTS

| | | | | |
|---|---|---|---|---|
| 8,496,379 B2 * | 7/2013 | Schnaitter | ............... | G01K 7/16 |
| | | | | 327/512 |
| 11,454,550 B2 | 9/2022 | Mori | | |
| 2005/0264971 A1 * | 12/2005 | Morino | ............... | H02H 5/044 |
| | | | | 361/103 |
| 2020/0177174 A1 * | 6/2020 | Sakaguchi | ......... | H03K 17/0822 |
| 2022/0182049 A1 * | 6/2022 | Takano | ............... | H03K 17/0822 |

FOREIGN PATENT DOCUMENTS

| | | |
|---|---|---|
| JP | 2000-020153 A | 1/2000 |
| JP | 2002-157029 A | 5/2002 |
| JP | 2010-103412 A | 5/2010 |
| JP | 2016-075594 A | 5/2016 |
| JP | 2019-184351 A | 10/2019 |
| JP | 2020-087250 A | 6/2020 |

* cited by examiner

OVERHEAD PROTECTION CIRCUIT

CROSS REFERENCE TO RELATED APPLICATION

This application is based upon and claims the benefit of priority from the prior Japanese Patent Application No. 2022-123275, filed on Aug. 2, 2022, the entire contents of which are incorporated herein by reference.

FIELD

The embodiments to be described herein are directed to an overheat protection circuit.

BACKGROUND

Semiconductor integrated circuits, semiconductor modules, and the like generate large amounts of heat during operation. The heat during the operation deteriorates or breaks the semiconductor integrated circuits, the semiconductor modules, and the like when they reach or exceed a predetermined temperature. For this reason, an overheat protection circuit is required.

Overheat protection circuits usually perform overheat temperature detection and overheat protection operation based on a fixed temperature regardless of the external environment and the use conditions.

Due to the increase in the output and degree of integration of semiconductor integrated circuits and semiconductor modules as well as the progress in systematization and so on, there is a strong demand for overheat protection circuits to have a function that renders the overheat detection temperature and overheat protection operation variable.

DETAILED DESCRIPTION

According to an embodiment, an overheat protection circuit includes a reference voltage generation circuit, a constant current source, a second voltage generation circuitry, an output current detection circuit, and a blocking controller. The reference voltage generation circuit generates a first voltage being a constant voltage. The constant current source generates a first current being a constant current. The second voltage generation circuitry causes a second current to flow to a ground potential side, and generates a second voltage which rises as the second current increases. The output current detection circuit generates a third current by subtracting the second current from the first current, and decreases the second current based on the third current as an output current generated by an output circuitry increases, the third current being proportional to the output current. The blocking controller compares the first and second voltages with each other, and generates a blocking control signal to block generation of the output current when the first voltage is higher than the second voltage. An overheat detection temperature drops as the second voltage drops, and detection of the overheat detection temperature is hastened as the output current increases.

A plurality of further embodiments will be described below with reference to the drawings. Throughout the drawings, identical reference signs designate identical or similar portions.

Figure 1:
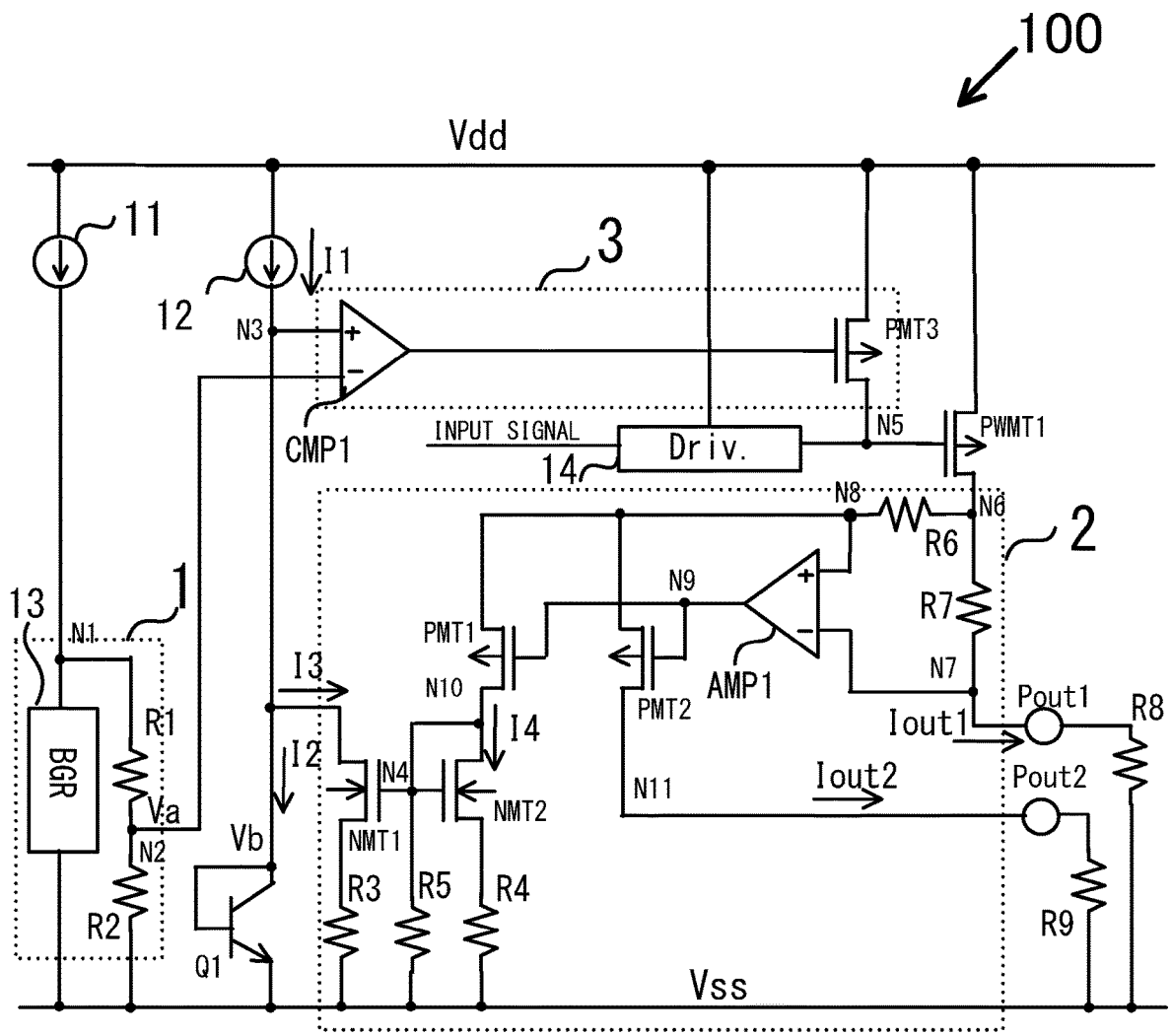
FIG. 1 is a circuit diagram showing an overheat protection circuit according to a first embodiment.

An overheat protection circuit according to a first embodiment will be described with reference to drawings. FIG. 1 is a circuit diagram showing the overheat protection circuit.

In the first embodiment, constant current sources, a second voltage generation circuitry, an output current detection circuit, and a blocking controller are used so as to lower the overheat detection temperature as the output current increases to thereby hasten the detection of the overheat detection temperature.

As shown in FIG. 1, an overheat protection circuit 100 includes a reference voltage generation circuit 1, an output current detection circuit 2, a blocking controller 3, constant current sources 11, 12, a driver 14, resistors R8, R9, a NPN transistor Q1, a MOS transistor PWMT1, and output terminals Pout1, Pout2.

The reference voltage generation circuit 1, the output current detection circuit 2, the blocking controller 3, the constant current sources 11, 12, the driver 14, the resistors R8, R9, the NPN transistor Q1, the output MOS transistor PWMT1, and the output terminals Pout1, Pout2 are mounted on the same circuit board, the same semiconductor module, or the like, for example.

The reference voltage generation circuit 1, the output current detection circuit 2, the blocking controller 3, the constant current sources 11, 12, and the NPN transistor Q1, which is the second voltage generation circuitry, are disposed adjacent to the output MOS transistor PWMT1, which is the output circuitry (main heat generation source).

The overheat protection circuit 100 detects an output current Iout1 generated by the output MOS transistor PWMT1, and lowers the overheat detection temperature as the output current Iout1 increases to thereby hasten the detection of the overheat detection temperature.

One end of the constant current source 11 is supplied with a power supply voltage (high potential-side power supply)

Vdd. The other end of the constant current source 11 is connected to the reference voltage generation circuit 1 (node N1). The constant current source 11 causes a constant current to flow to the reference voltage generation circuit 1 side.

The reference voltage generation circuit 1 is provided between the constant current source 11 and a ground potential Vss (low potential-side power supply), and includes a bandgap reference circuit 13 and resistors R1, R2. The bandgap reference circuit 13 is provided between the node N1 and the ground potential Vss (low potential-side power supply), and generates a constant voltage that is not dependent on the power supply voltage or temperature. The resistors R1, R2 are provided between the node N1 and the ground potential Vss (low potential-side power supply), and are connected to each other in series. A voltage Va subjected to a resistive division with the resistors R1, R2 is output from a node N2 (between the resistors R1, R2). The voltage Va is a constant voltage.

One end of the constant current source 12 is supplied with the power supply voltage (high potential-side power supply) Vdd. The other end of the constant current source 12 is connected to a node N3. The constant current source 12 causes a constant current I1 to flow to the node N3 side. The NPN transistor Q1 is a diode provided between the node N3 and the ground potential Vss (low potential-side power supply). A collector of the diode is connected to a base of the diode. The NPN transistor Q1 (second voltage generation circuitry) causes a current I2 to flow to the ground potential Vss (low potential-side power supply) side, and generates a voltage Vb (second voltage) which rises as the current I2 increases and drops as the current I2 decreases.

The output current detection circuit 2 includes an amplification circuit AMP1, N-channel MOS transistors NMT1, NMT2, P-channel MOS transistors PMT1, PMT2, and resistors R3 to R7.

The driver 14 is supplied with the power supply voltage Vdd (high potential-side power supply), receives an input signal, and outputs a signal to control the output MOS transistor PWMT1 to a gate of the output MOS transistor PWMT1.

The output MOS transistor PWMT1, which is the output circuitry, is a P-channel power MOS transistor. A source of the output MOS transistor PWMT1 is supplied with the power supply voltage Vdd. A drain of the output MOS transistor PWMT1 is connected to a node N6. The output MOS transistor PWMT1 is turned on and causes the output current Iout1 to flow to the node N6 side when an enabled signal (low level) is input to a gate of the output MOS transistor PWMT1, and is turned off when a disabled signal (high level) is input to the gate.

The resistor R6 is provided between the node N6 and a node N8. The resistor R7 is provided between the node N6 and a node N7. The output terminal Pout1 is provided between the node N7 and the resistor R8, and causes the output current Iout1 to flow to the resistor R8 side.

The amplification circuit AMP1 is provided between the nodes N7, N8 and a node N9. An input-side negative (−) port of the amplification circuit AMP1 is connected to the node N7, an input-side positive (+) port of the amplification circuit AMP1 is connected to the node N8. The amplification circuit AMP1 operates such that the positive (+) input and the negative (−) input are at the same potential after the voltage drop by the resistor R7.

A source of the P-channel MOS transistor PMT2 is connected to the node N8, a gate of the P-channel MOS transistor PMT2 is connected to the node N9, a drain of the P-channel MOS transistor PMT2 is connected to the node N11. The amplification circuit AMP1 operates so as to cause the resistor R6 to induce the same voltage drop as that by the resistor R7 by turning on the P-channel MOS transistor PMT2 to cause a current to flow through the resistor R6.

As a result, a detection current Iout2 output from the P-channel MOS transistor PMT2 becomes a current sense output corresponding to the output current Iout1 and is output through the output terminal Pout2. A voltage equal to the voltage drop by the resistor R7 multiplied by a gain (resistor R9/resistor R6) is output through the output terminal Pout2.

A source of the P-channel MOS transistor PMT1 is connected to the node N8, a gate of the P-channel MOS transistor PMT1 is connected to the node N9, a drain of the P-channel MOS transistor PMT1 is connected to the node N10.

The source (node N8) of the P-channel MOS transistor PMT1 and the source (node N8) of the P-channel MOS transistor PMT2 are set at the same potential. The gate (node N9) of the P-channel MOS transistor PMT1 and the gate (node N9) of the P-channel MOS transistor PMT2 are set at the same potential. Thus, a current I4 flowing on the drain (node N10) side of the P-channel MOS transistor PMT1 is a current being the detection current Iout2 multiplied by a mirror ratio. The mirror ratio is Wg (gate width)/Lg (gate length) of the P-channel MOS transistor PMT1÷Wg (gate width)/Lg (gate length) of the P-channel MOS transistor PMT2.

A drain of the N-channel MOS transistor NMT2 is connected to the node N10, a gate of the N-channel MOS transistor NMT2 is connected to the node N4 and the drain of the N-channel MOS transistor NMT2, a source of the N-channel MOS transistor NMT2 is connected to one end of the resistor R4. A drain of the N-channel MOS transistor NMT1 is connected to the node N3, a gate of the N-channel MOS transistor NMT1 is connected to the node N4 and the gate of the N-channel MOS transistor NMT2, a source of the N-channel MOS transistor NMT1 is connected to one end of the resistor R3.

The N-channel MOS transistors NMT2, NMT1 form a current mirror circuit. A current I3 flowing on the source side of the N-channel MOS transistor NMT1 is a current being the current I4 multiplied by a mirror ratio. The mirror ratio is Wg (gate width)/Lg (gate length) of the N-channel MOS transistor NMT1÷Wg (gate width)/Lg (gate length) of the N-channel MOS transistor NMT2.

One end of the resistor R3 is connected to the source of the N-channel MOS transistor NMT1. The other end of the resistor R3 is connected to the ground potential (low potential-side power supply) Vss. One end of the resistor R4 is connected to the source of the N-channel MOS transistor NMT2. The other end of the resistor R4 is connected to the ground potential (low potential-side power supply) Vss. One end of the resistor R5 is connected to the node N4. The other end of the resistor R5 is connected to the ground potential (low potential-side power supply) Vss.

The blocking controller 3 includes a comparator CMP1 and a P-channel MOS transistor PMT3. The comparator CMP1 receives the voltage Va (node N2) through an input-side negative (−) port and the voltage Vb (node N3) through an input-side positive (+) port, and compares the voltages Va, Vb with each other. The comparator CMP1 outputs a high-level signal when the voltage Va is lower than the voltage Vb, and outputs a low-level (output inversion) signal when the voltage Va is higher than the voltage Vb.

A source of the P-channel MOS transistor PMT3 is supplied with the power supply voltage (high potential-side power supply) Vdd. The output signal of the comparator CMP1 is input to a gate of the P-channel MOS transistor PMT3. A drain of the P-channel MOS transistor PMT3 is connected to the gate (node N5) of the output MOS transistor PWMT1. When the voltage Va is higher than the voltage Vb, the P-channel MOS transistor PMT3 is turned on to output a blocking control signal (high-level signal) to block the generation of the output current Iout1 to the gate of the output MOS transistor PWMT1.

Figure 2:
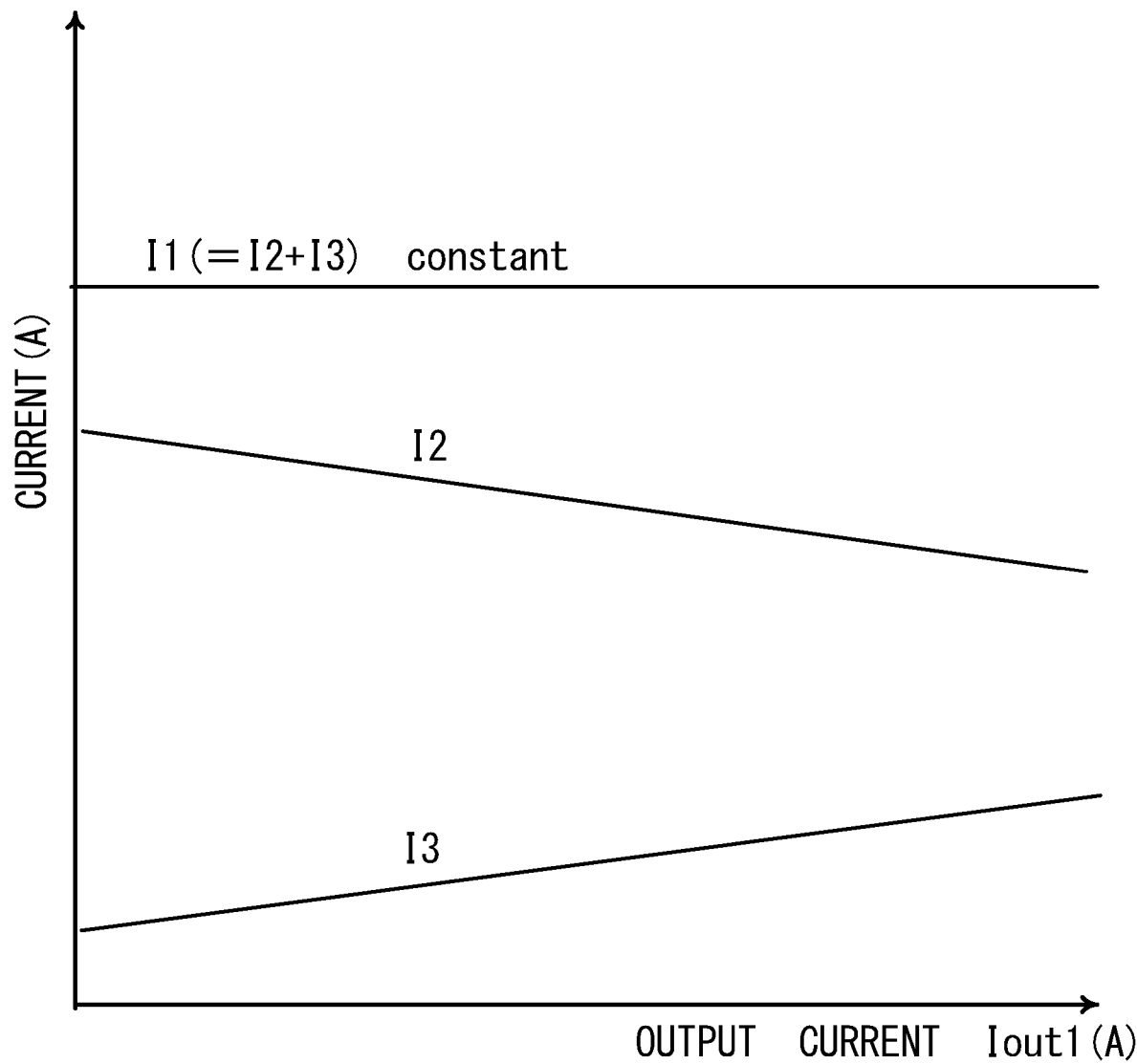
FIG. 2 is a graph showing how a first current (I1), a second current (I2), and a third current (I3) shift relative to an output current (Iout1) according to the first embodiment.
Figure 3:
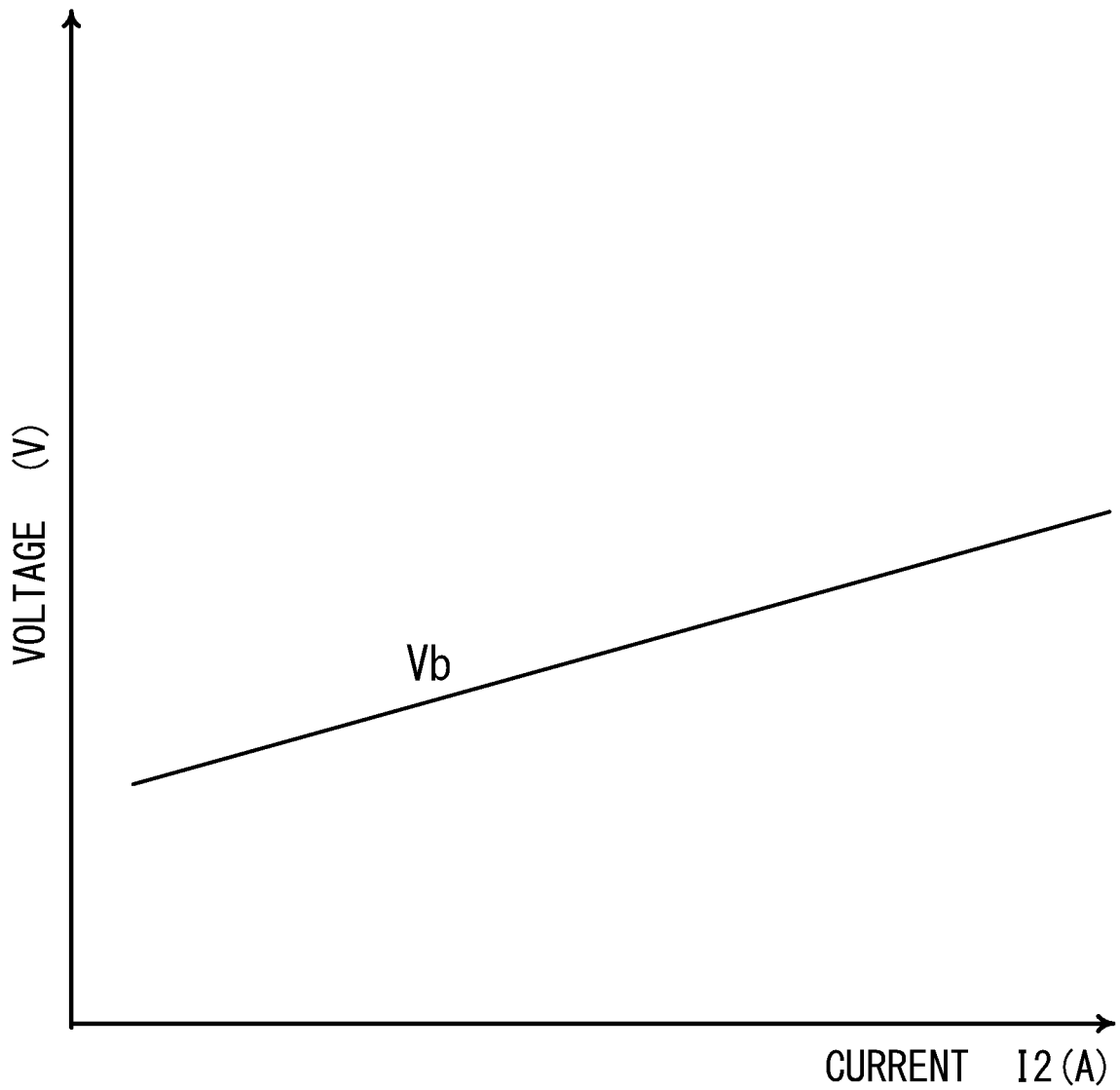
FIG. 3 is a graph showing how a second voltage (Vb) shifts relative to the second current (I2) according to the first embodiment.
Figure 4:
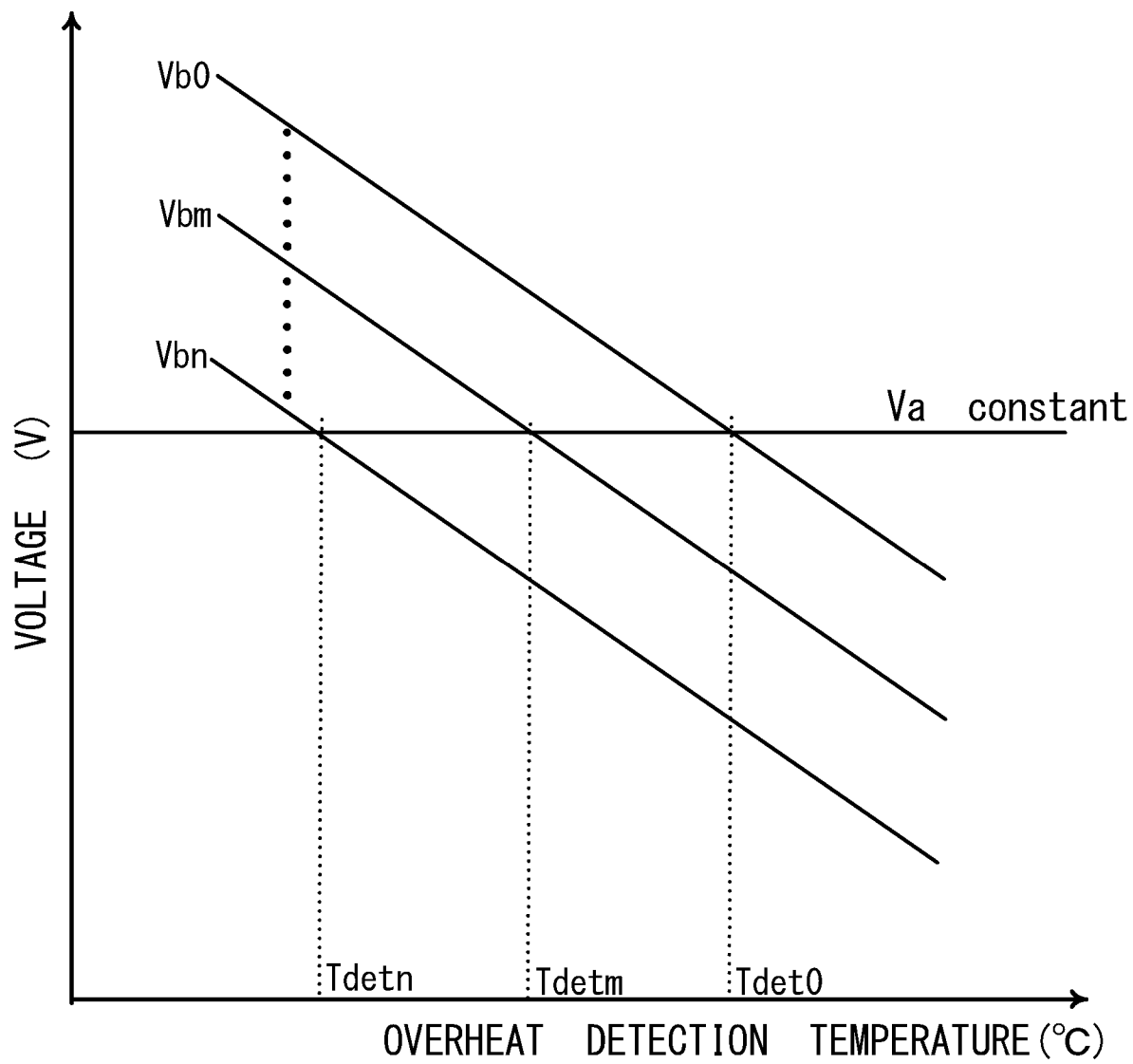
FIG. 4 is a graph showing a relationship of overheat detection temperatures (Tdet0, Tdetm, Tdetn) with second voltages (Vb0, Vbm, Vbn) according to the first embodiment.

Next, a relationship between the output current Iout1 and the currents I1 (first current), I2 (second current), I3 (third current), a relationship between the current I2 (second current) and the voltage Vb (second voltage), and a relationship between the voltage Vb (second voltage) and the overheat detection temperature will be described with reference to FIGS. 2, 3, and 4, respectively. FIG. 2 is a graph showing how the currents I1 (first current), I2 (second current), I3 (third current) shift relative to the output current Iout1. FIG. 3 is a graph showing how the voltage Vb (second voltage) shifts relative to the current I2 (second current). FIG. 4 is a graph showing a relationship of overheat detection temperatures Tdet0, Tdetm, Tdetn with voltages Vb0, Vbm, Vbn (second voltages).

As shown in FIG. 2, a relationship between the currents I1, I2, I3 is represented as below.

$$I1 = I2 + I3 \qquad \text{Equation (1)}$$

The value of the current I1 is constant and is not dependent on the increase or decrease of the output current Iout1.

The output current detection circuit 2 generates the current I3 proportional to the output current Iout1, and generates the current I2 based on the current I3 by subtracting the current I3 from the current I1. Hence, the current I2 decreases as the output current Iout1 increases.

As shown in FIG. 3, the voltage Vb (second voltage) rises as the current I2 (second current) increases.

As shown in FIG. 4, the value of the voltage Va (first voltage) is constant and is not dependent on the overheat detection temperature. When the output current Iout1 is low, the voltage Vb0 (second voltage) has a large value, and the overheat detection temperature Tdet0, which represents the intersection between the voltage Va (first voltage) and the voltage Vb0 (second voltage), has a large value. As the output current Iout1 increases, the overheat detection temperature Tdetm, which represents the intersection between the voltage Va (first voltage) and the voltage Vbm (second voltage), drops below the overheat detection temperature Tdet0. As the output current Iout1 increases further, the overheat detection temperature Tdetn, which represents the intersection between the voltage Va (first voltage) and the voltage Vbn (second voltage), drops below the overheat detection temperature Tdetm.

Thus, the overheat protection circuit 100 in the embodiment can render the overheat detection temperature and overheat protection operation variable. Specifically, the overheat protection circuit 100 in the embodiment lowers the overheat detection temperature as the output current Iout1 increases to thereby hasten the detection of the overheat detection temperature, and executes the overheat protection operation based on the overheat detection temperature thus rendered variable.

Figure 5:
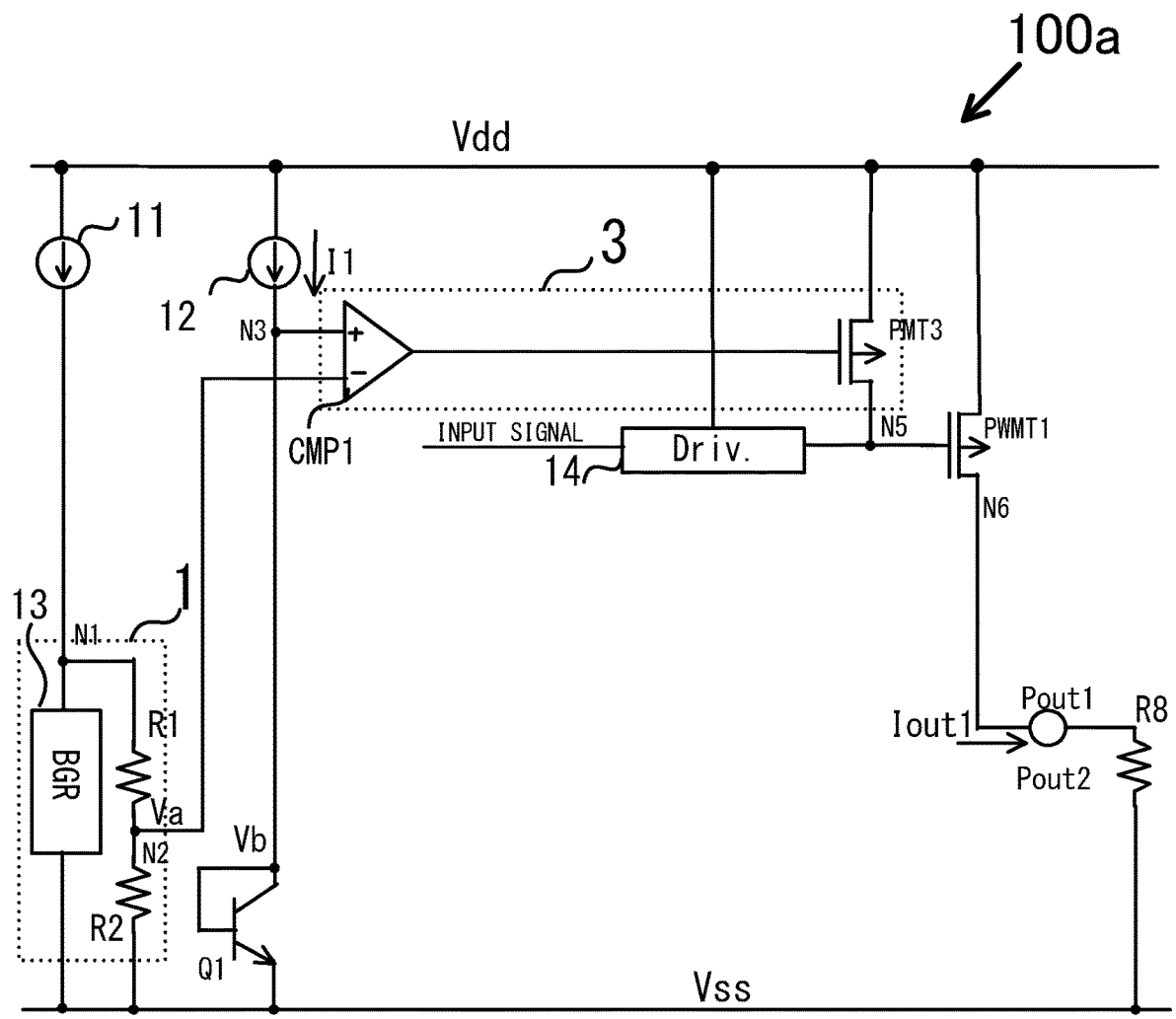
FIG. 5 is a circuit diagram showing an overheat protection circuit in a comparative example.

Next, an overheat protection circuit in a comparative example will be described with reference to a drawing. FIG. 5 is a circuit diagram showing the overheat protection circuit in the comparative example.

As shown in FIG. 5, an overheat protection circuit 100a in the comparative example includes the reference voltage generation circuit 1, the blocking controller 3, the constant current sources 11, 12, the driver 14, the resistor R8, the NPN transistor Q1, the output MOS transistor PWMT1, and the output terminal Pout1. The overheat protection circuit 100a in the comparative example is provided with none of the output current detection circuit 2, the resistor R9, the output MOS transistor PWMT1, and the output terminal Pout2 of the overheat protection circuit 100 in the embodiment.

The overheat protection circuit 100a in the comparative example is not provided with means for rendering the overheat detection temperature variable. The overheat protection circuit 100a in the comparative example detects a predetermined overheat detection temperature by using constant voltages Va, Vb.

As described above, the overheat protection circuit 100 in the embodiment is provided with the reference voltage generation circuit 1, the output current detection circuit 2, the blocking controller 3, the constant current sources 11, 12, the driver 14, the resistors R8, R9, the NPN transistor Q1, the output MOS transistor PWMT1, and the output terminals Pout1, Pout2. The overheat protection circuit 100 in the embodiment renders the overheat detection temperature variable by using the constant current sources 11, 12, the NPN transistor Q1, which is the second voltage generation circuitry with a collector grounded to the base of the second voltage generation circuitry, the output current detection circuit 2, and the blocking controller 3.

Consequently, the overheat protection circuit 100 in the embodiment can lower the overheat detection temperature as the output current Iout1 increases to thereby hasten the detection of the overheat detection temperature, and can execute the overheat protection operation based on the overheat detection temperature thus rendered variable. Moreover, the overheat protection circuit 100 in the embodiment can improve the safety of the circuit board or the semiconductor module on which the overheat protection circuit is mounted.

Note that the overheat protection circuit 100 in the embodiment uses the output MOS transistor PWMT1, which is a power MOS transistor, as the output circuitry. Alternatively, an output driver, a high-side switch, a low-side switch, a regulator, a processor, a central processing unit (CPU), or the like may be used as the output circuitry.

Moreover, the overheat protection circuit 100 in the embodiment may be provided with a temperature sensor that detects an ambient temperature of the output MOS transistor PWMT1, which is the output circuitry, and a storage unit that stores temperature information detected by the temperature sensor. The temperature information detected by the temperature sensor may be stored in a lookup table or the like in association with the output current Iout1 in advance, and compared with the intersection between the voltages Va, Vb.

Figure 6:
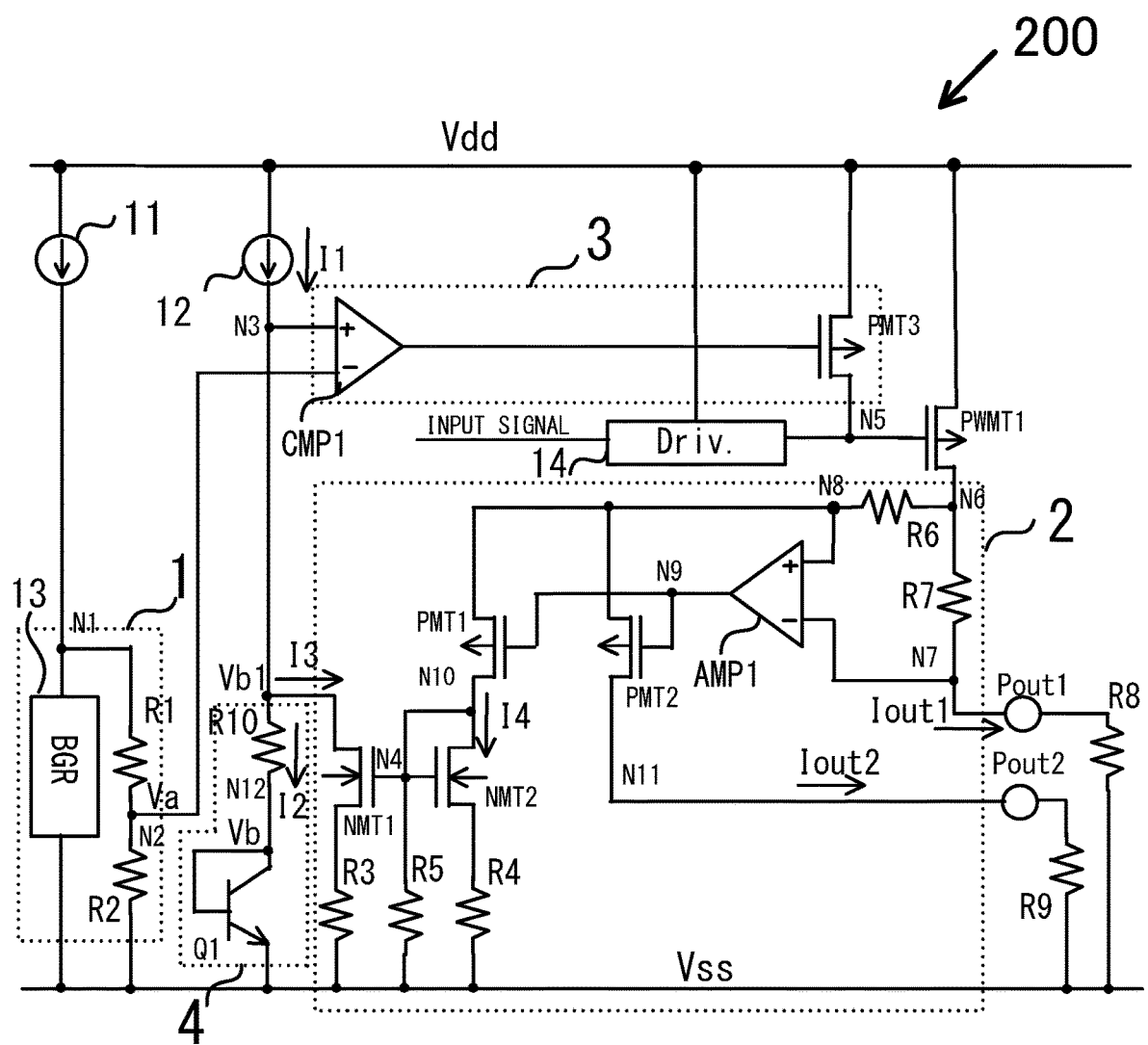
FIG. 6 is a circuit diagram showing an overheat protection circuit according to a second embodiment.

An overheat protection circuit according to a second embodiment will be described with reference to a drawing. FIG. 6 is a circuit diagram showing the overheat protection circuit.

In the second embodiment, the second voltage generation circuitry includes a resistor and an NPN transistor with a collector grounded to a base of the NPN transistor, and adjusts a temperature characteristic of the second voltage, the resistor and the NPN transistor being connected to each other in series.

In the following, identical component portions to those in the first embodiment are designated by identical reference signs, and description of the portions is omitted. Only different portions will be described.

As shown in FIG. 6, an overheat protection circuit 200 includes the reference voltage generation circuit 1, the output current detection circuit 2, the blocking controller 3, the constant current sources 11, 12, the driver 14, the resistors R8, R9, a resistor R10, the NPN transistor Q1, the output MOS transistor PWMT1, and the output terminals Pout1, Pout2. A second voltage generation circuitry 4 is composed of the NPN transistor Q1 and the resistor R10. The resistor R10 and the NPN transistor are connected to each other in series.

The reference voltage generation circuit 1, the output current detection circuit 2, the blocking controller 3, the constant current sources 11, 12, the driver 14, the resistors R8, R9, R10, the NPN transistor Q1, the output MOS transistor PWMT1, and the output terminals Pout1, Pout2 are mounted on the same circuit board, semiconductor module, or the like, for example.

The reference voltage generation circuit 1, the output current detection circuit 2, the blocking controller 3, the second voltage generation circuitry 4, the constant current sources 11, 12 are disposed adjacent to the output MOS transistor PWMT1, which is the output circuitry.

One end of the resistor R10 is connected to the node N3. The other end of the resistor R10 is connected to a node N12. The one end of the resistor R10 is set at a voltage Vb1 (second voltage). The resistor R10 causes the current I2 (second current) to flow to the ground potential (low potential-side power supply) Vas side.

The current I3 (third current) flows from the node N3 to the output current detection circuit 2 side. The NPN transistor Q1 is a diode with a collector connected to the node N12 and a base of the diode, and with an emitter connected to the ground potential (low potential-side power supply) Vss. The collector and base of the NPN transistor Q1 are set at the voltage Vb (second voltage). The voltage Vb (second voltage) is lower than the voltage Vb1 (second voltage) by the voltage drop by the resistor R10.

The resistor R10 and the NPN transistor Q1 with the collector grounded to the base of the NPN transistor Q1, which are connected to each other in series, function as the second voltage generation circuitry, and adjust the temperature characteristic of the voltage Vb1 (second voltage). To adjust the temperature characteristic of the voltage Vb1 (second voltage), the resistor R10 is made from material having the same temperature coefficient as that of the resistors R3, R4 or material having a different temperature coefficient from that of the resistors R3, R4, for example.

As described above, the overheat protection circuit 200 in the embodiment is provided with the reference voltage generation circuit 1, the output current detection circuit 2, the blocking controller 3, the constant current sources 11, 12, the driver 14, the resistors R8, R9, R10, the NPN transistor Q1, the output MOS transistor PWMT1, and the output terminals Pout1, Pout2. The resistor R10 and the NPN transistor Q1 with the collector grounded to the base of the NPN transistor Q1, which are connected to each other in series, function as the second voltage generation circuitry 4, and adjust the temperature characteristic of the voltage Vb1 (second voltage).

Consequently, it is possible to achieve the advantageous effect of the first embodiment and, additionally, adjust the temperature characteristic of the second voltage.

Figure 7:
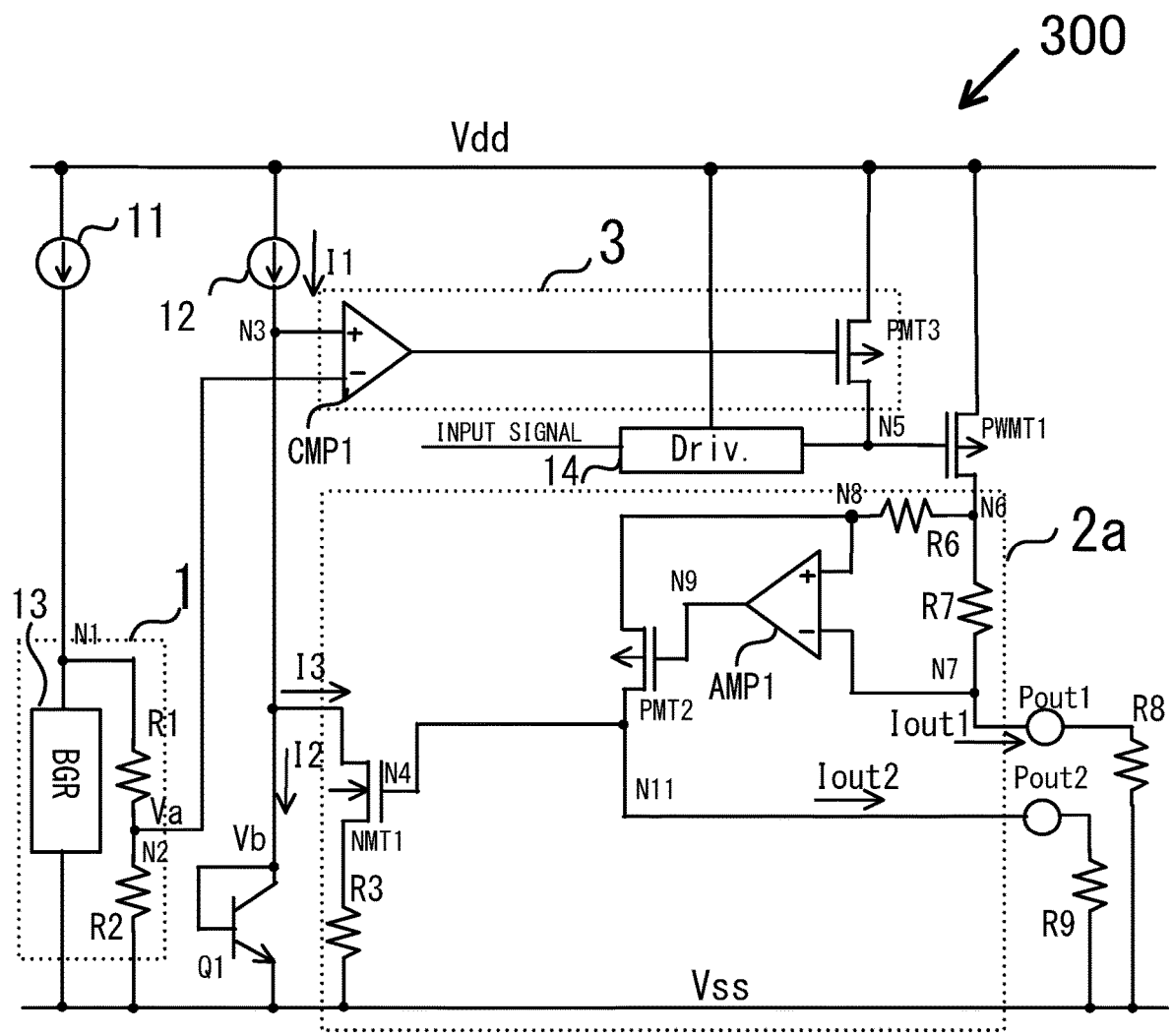
FIG. 7 is a circuit diagram showing an overheat protection circuit according to a third embodiment.

An overheat protection circuit according to a third embodiment will be described with reference to a drawing. FIG. 7 is a circuit diagram showing the overheat protection circuit.

In the third embodiment, the configuration of the output current detection circuit is made simpler than that in the first embodiment.

In the following, identical component portions to those in the first embodiment are designated by identical reference signs, and description of the portions is omitted. Only different portions will be described.

As shown in FIG. 7, an overheat protection circuit 300 includes the reference voltage generation circuit 1, an output current detection circuit 2a, the blocking controller 3, the constant current sources 11, 12, the driver 14, the resistors R8, R9, the NPN transistor Q1, the output MOS transistor PWMT1, and the output terminals Pout1, Pout2.

The reference voltage generation circuit 1, the output current detection circuit 2a, the blocking controller 3, the constant current sources 11, 12, the driver 14, the resistors R8, R9, the NPN transistor Q1, the output MOS transistor PWMT1, and the output terminals Pout1, Pout2 are mounted on the same circuit board, the same semiconductor module, or the like, for example.

The reference voltage generation circuit 1, the output current detection circuit 2a, the blocking controller 3, the constant current sources 11, 12, and the NPN transistor Q1, which is the second voltage generation circuitry, are disposed adjacent to the output MOS transistor PWMT1, which is the output circuitry.

The output current detection circuit 2a includes the amplification circuit AMP1, the N-channel MOS transistor NMT1, the P-channel MOS transistor PMT2, and the resistors R3, R6, R7. The output current detection circuit 2a is provided none of the N-channel MOS transistor NMT2, the P-channel MOS transistor PMT1, and the resistors R4, R5 in the output current detection circuit 2 in the first embodiment.

A drain of the N-channel MOS transistor NMT1 is connected to the node N3, a gate of the N-channel MOS transistor NMT1 is connected to a drain (the node N11) of the P-channel MOS transistor PMT2, a source of the N-channel MOS transistor NMT1 is connected to the node is connected to the ground potential (low potential-side power supply) through the resistor R3. The N-channel MOS transistor NMT1 causes the current I3 (third current) to flow from the node N3 to the drain side.

As the detection current Iout2 increases, the potential at the gate (node N11) of the N-channel MOS transistor NMT1 rises, thereby increasing the current I3 (third current) flowing through the N-channel MOS transistor NMT1 from the node N3 to the drain side.

The output current detection circuit 2 of the overheat protection circuit 100 in the first embodiment uses a current mirror circuit, etc. to improve the accuracy (linearity) of the current I3 (third current) relative to the output current Iout1. In contrast, the output current detection circuit 2a of the overheat protection circuit 300 in the third embodiment does not use a current mirror circuit, etc. to thereby simplify the circuit configuration. Accordingly, the linearity of the current I3 (third current) relative to the output current Iout1 is lower than that with the output current detection circuit 2 of the overheat protection circuit 100 in the first embodiment.

As described above, the overheat protection circuit 300 in the third embodiment is provided with the reference voltage generation circuit 1, the output current detection circuit 2a, the blocking controller 3, the constant current sources 11, 12, the driver 14, the resistors R8, R9, the NPN transistor Q1, the output MOS transistor PWMT1, and the output terminals Pout1, Pout2. The output current detection circuit 2*a* has a simplified circuit configuration.

Consequently, it is possible to achieve the advantageous effect of the first embodiment and, additionally, simplify the circuit configuration of the overheat protection circuit.

Figure 8:
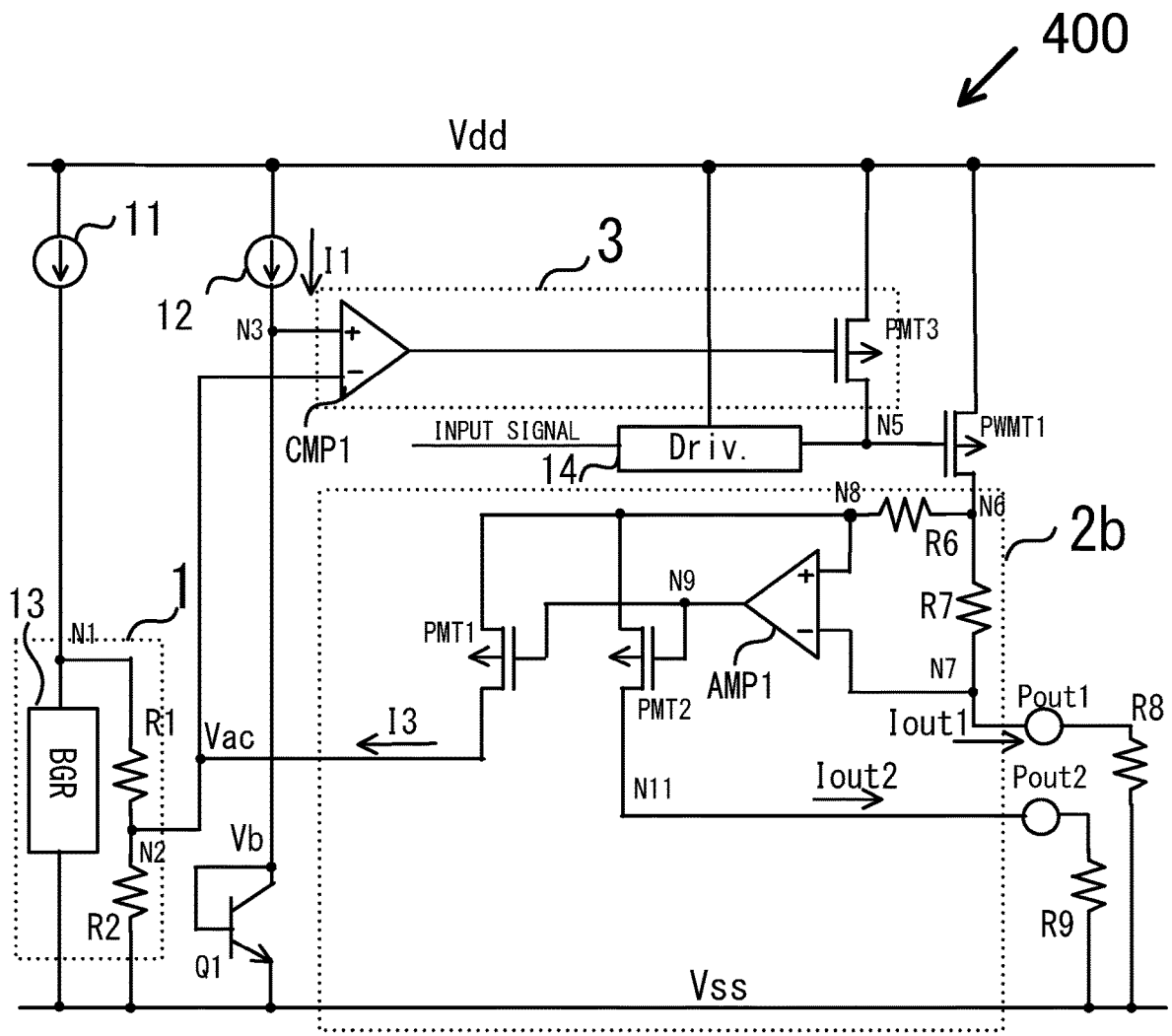
FIG. 8 is a circuit diagram showing an overheat protection circuit according to a fourth embodiment.

An overheat protection circuit according to a fourth embodiment will be described with reference to drawings. FIG. 8 is a circuit diagram showing the overheat protection circuit.

In the fourth embodiment, the third current, which increases with the output current, is caused to flow into the reference voltage generation circuit to add a voltage which increases with the output current to the first voltage, which is a constant voltage, and thereby convert the first voltage into a third voltage, which is a variable voltage, and the third voltage is input to the input-side negative (−) port of the comparator.

In the following, identical component portions to those in the first embodiment are designated by identical reference signs, and description of the portions is omitted. Only different portions will be described.

As shown in FIG. 8, an overheat protection circuit 400 includes the reference voltage generation circuit 1, an output current detection circuit 2*b*, the blocking controller 3, the constant current sources 11, 12, the driver 14, the resistors R8, R9, the NPN transistor Q1, the output MOS transistor PWMT1, and the output terminals Pout1, Pout2.

The reference voltage generation circuit 1, the output current detection circuit 2*b*, the blocking controller 3, the constant current sources 11, 12, the driver 14, the resistors R8, R9, the NPN transistor Q1, the output MOS transistor PWMT1, and the output terminals Pout1, Pout2 are mounted on the same circuit board, the same semiconductor module, or the like, for example.

The reference voltage generation circuit 1, the output current detection circuit 2*b*, the blocking controller 3, the constant current sources 11, 12, and the NPN transistor Q1, which is the second voltage generation circuitry, are disposed adjacent to the output MOS transistor PWMT1, which is the output circuitry.

The NPN transistor Q1 is a diode provided between the constant current source 12 (node N3) and the ground potential Vss (low potential-side power supply). A collector of the diode is connected to a base of the diode. The NPN transistor Q1 with the collector connected to the base of the NPN transistor Q1 causes the constant current I1 (first current) from the collector side to the ground potential (low potential-side power supply) Vss. The collector of the NPN transistor Q1 is set at the voltage Vb (second voltage).

The output current detection circuit 2*b* includes the amplification circuit AMP1, the P-channel MOS transistors PMT1, PMT2, and the resistors R6, R7. The output current detection circuit 2*b* in the embodiment omits the N-channel MOS transistors NMT1, NMT2 and the resistors R3 to R5 of the output current detection circuit 2 in the first embodiment, and causes the current flowing from the drain side of the P-channel MOS transistor PMT1 to flow into the node N2 of the reference voltage generation circuit 1 as the current I3 (third current).

The current I3 (third current) flows to the ground potential (low potential-side power supply) Vas from the node N2 through the resistor R2. Accordingly, at the node N2, a voltage Vac (third voltage) is generated which is higher by the resistor R2×the current I3 (third current) than the constant voltage Va (first voltage) generated in the case where the current I3 (third current) does not flow into the node.

The comparator CMP1 receives the voltage Vac (third voltage) through the input-side negative (−) port and the voltage Vb (second voltage) through the input-side positive (+) port, and compares the voltage Vac (third voltage) and the voltage Vb (second voltage) with each other.

Figure 9:
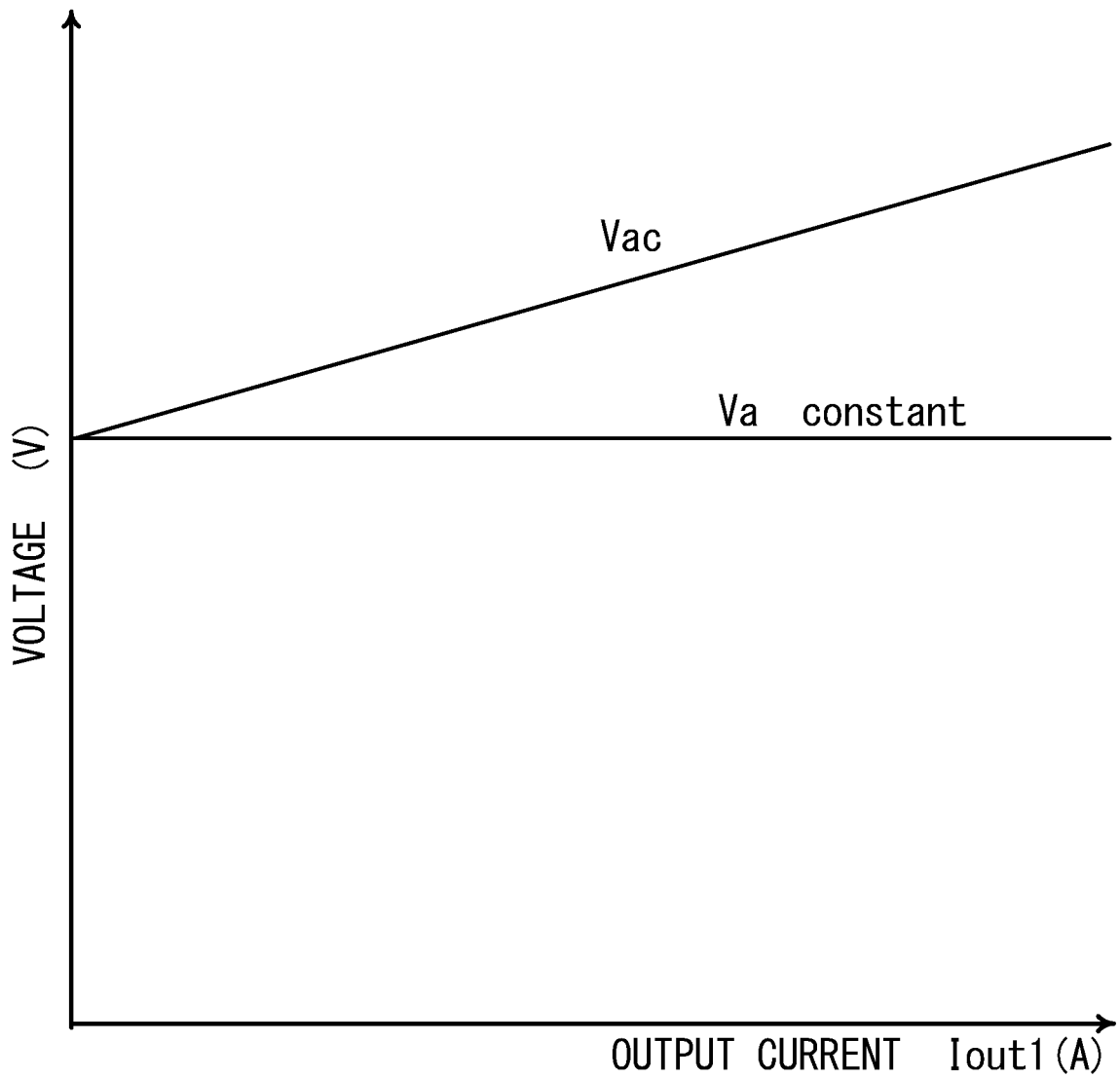
FIG. 9 is a graph showing how a first voltage (Va) and a third voltage (Vac) shift relative to an output current (Iout1) according to the fourth embodiment.
Figure 10:
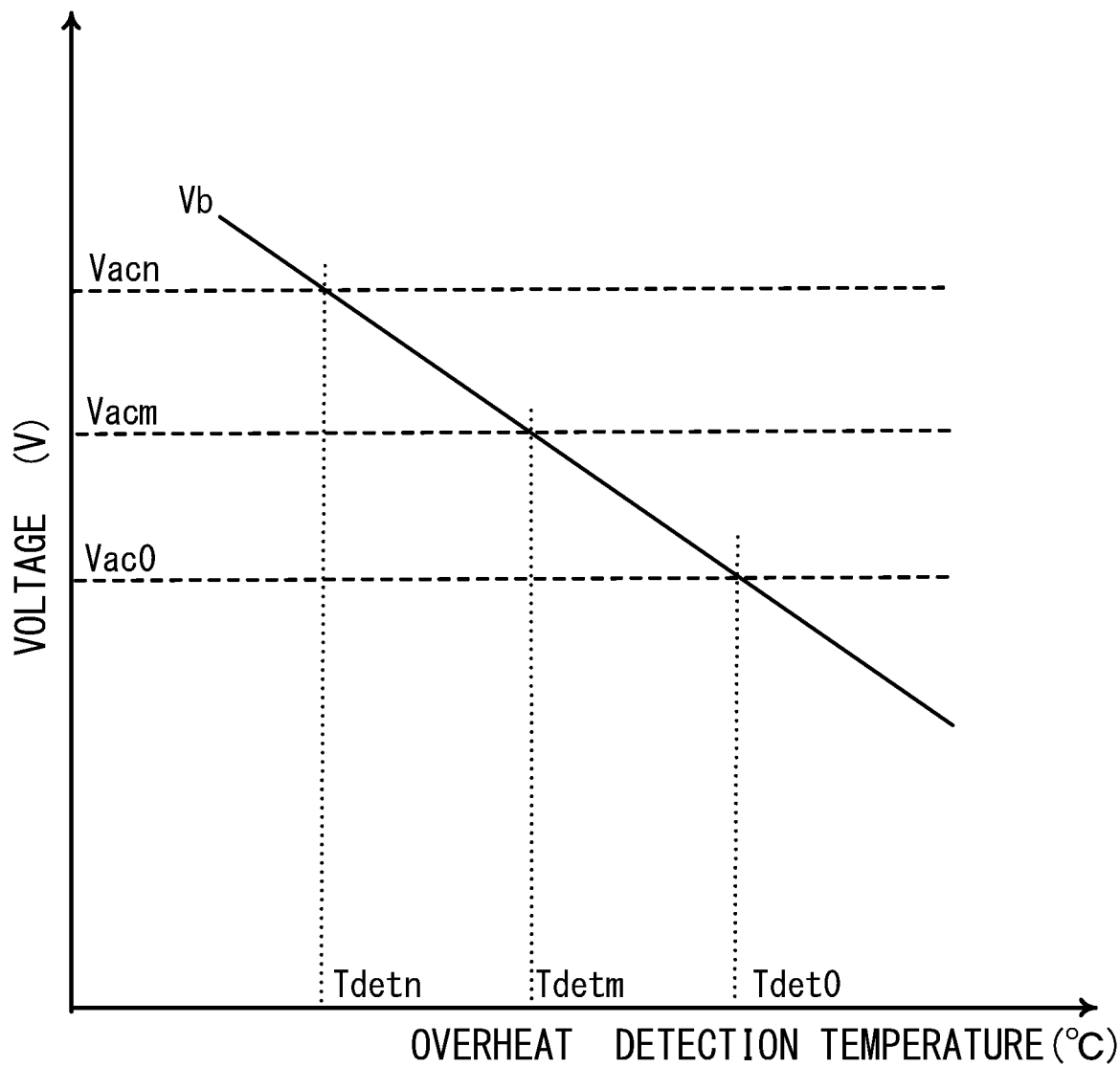
FIG. 10 is a graph showing a relationship of overheat detection temperatures (Tdet0, Tdetm, Tdetn) with third voltages (Vac0, Vacm, Vacn) and a second voltage (Vb) according to the fourth embodiment.

Next, relationships between the output current Iout1, the voltage Va (first voltage), the voltage Vb (second voltage), the voltage Vac (third voltage), and overheat detection temperatures Tdet0, Tdetm, Tdetn will be described with reference to FIGS. 9 and 10. FIG. 9 is a graph showing how the voltage Va (first voltage) and the voltage Vac (third voltage) shift relative to the output current Iout1. FIG. 10 is a graph showing a relationship of the overheat detection temperatures Tdet0, Tdetm, Tdetn with voltages Vac0, Vacm, Vacn (third voltages) and the voltage Vb (second voltage).

As shown in FIG. 9, the voltage Va (first voltage) is a voltage that remains constant regardless of whether the output current Iout1 increases or decreases, whereas the voltage Vac (third voltage) is a voltage obtained by adding the resistor R2×the current I3 to the voltage Va (first voltage). Hence, the voltage Vac (third voltage) increases in proportion to the output current Iout1.

As shown in FIG. 10, the voltage Vb (second voltage) gradually drops as the overheat detection temperature rises. When the output current Iout1 is relatively small, the value of the voltage Vac0 (third voltage) is small. As the output current Iout1 increases, the voltage Vacm (third voltage) rises above the voltage Vac0 (third voltage). As the output current Iout1 increases further, the voltage Vacn (third voltage) rises above the voltage Vacm (third voltage). As the output current Iout1 increases, the overheat detection temperature Tdetm, which represents the intersection between the voltage Vacm (third voltage) and the voltage Vb (second voltage), drops below the overheat detection temperature Tdet0. As the output current Iout1 increases further, the overheat detection temperature Tdetn, which represents the intersection between the voltage Vacn (third voltage) and the voltage Vb (second voltage), drops below the overheat detection temperature Tdetm.

Thus, the overheat protection circuit 400 in the embodiment can render the overheat detection temperature and overheat protection operation variable. Specifically, the overheat protection circuit 400 in the embodiment lowers the overheat detection temperature as the output current Iout1 increases to thereby hasten the detection of the overheat detection temperature, and executes the overheat protection operation based on the overheat detection temperature thus rendered variable.

As described above, the overheat protection circuit 400 in the fourth embodiment is provided with the reference voltage generation circuit 1, the output current detection circuit 2*b*, the blocking controller 3, the constant current sources 11, 12, the driver 14, the resistors R8, R9, the NPN transistor Q1, the output MOS transistor PWMT1, and the output terminals Pout1, Pout2. The current I3 generated by the output current detection circuit 2*b*, which increases with the output current Iout1, is caused to flow into the reference voltage generation circuit 1 to add a voltage which increases with the output current Iout1 to the voltage Va, which is a constant voltage, and thereby convert the voltage Va to the voltage Vac (third voltage), which is a variable voltage. The comparator receives the voltage Vac (third voltage) through the input-side negative (−) port and the voltage Vb (second voltage), which drops as the output current Iout1 increases, through the input-side positive (+) port, and compares the voltage Vac (third voltage) and the voltage Vb (second voltage) with each other.

Consequently, the overheat protection circuit 400 in the embodiment can lower the overheat detection temperature as the output current Iout1 increases to thereby hasten the detection of the overheat detection temperature, and can execute the overheat protection operation based on the overheat detection temperature thus rendered variable. Moreover, the overheat protection circuit 400 in the embodiment can improve the safety of the circuit board or the semiconductor module on which the overheat protection circuit is mounted.

Figure 11:
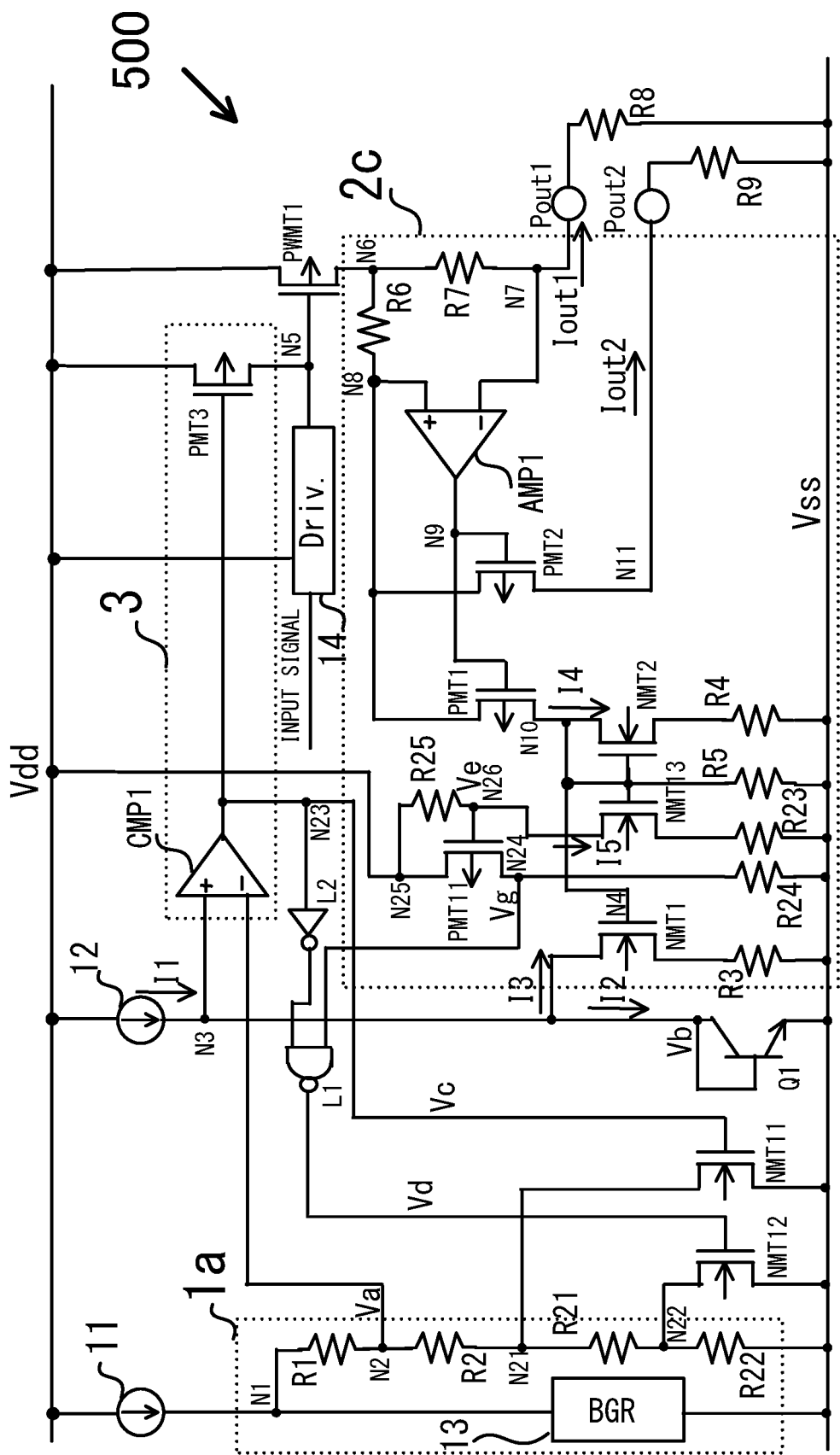
FIG. 11 is a circuit diagram showing an overheat protection circuit according to a fifth embodiment.

An overheat protection circuit according to a fifth embodiment will be described with reference to drawings. FIG. 11 is a circuit diagram showing the overheat protection circuit.

In the fifth embodiment, a hysteresis generation circuitry is provided which widens the hysteresis width between the overheat detection temperature and the return temperature when the output current increases.

In the following, identical component portions to those in the first embodiment are designated by identical reference signs, and description of the portions is omitted. Only different portions will be described.

As shown in FIG. 11, an overheat protection circuit 500 includes a reference voltage generation circuit 1a, an output current detection circuit 2c, the blocking controller 3, the constant current sources 11, 12, the driver 14, the resistors R8, R9, the NPN transistor Q1, the output MOS transistor PWMT1, the output terminals Pout1, Pout2, a NAND circuit L1, an inverter L2, and N-channel MOS transistors NMT11, NMT12.

The reference voltage generation circuit 1a, the output current detection circuit 2c, the blocking controller 3, the constant current sources 11, 12, the driver 14, the resistors R8, R9, the NPN transistor Q1, the output MOS transistor PWMT1, the output terminals Pout1, Pout2, the NAND circuit L1, the inverter L2, and the N-channel MOS transistors NMT11, NMT12 are mounted on the same circuit board, the same semiconductor module, or the like, for example.

The reference voltage generation circuit 1a, the output current detection circuit 2c, the blocking controller 3, the constant current sources 11, 12, the NPN transistor Q1, which is the second voltage generation circuitry, the NAND circuit L1, the inverter L2, and the N-channel MOS transistors NMT1l, NMT12 are disposed adjacent to the output MOS transistor PWMT1, which is the output circuitry.

The reference voltage generation circuit 1a includes the bandgap reference circuit 13, the resistors R1, R2, and resistors R21, R22. The resistors R1, R2, R21, R22, which are connected to one another in series, are disposed in parallel with the bandgap reference circuit 13. The resistors R1, R2, R21, R22 connected in series and the bandgap reference circuit 13 are provided between the node N1 and the ground potential (low potential-side power supply) Vss.

One end of the resistor R1 is connected to the node N1. The other end of the resistor R1 is connected to the node N2. The voltage Va (first voltage) set at the node N2 is input to the input-side negative (−) port of the comparator CMP1. The one end of the resistor R2 is connected to the node N2. The other end of the resistor R2 is connected to the node N21. One end of the resistor R21 is connected to the node N21. The other end of the resistor R21 is connected to a node N22. One end of the resistor R22 is connected to the node N22. The other end of the resistor R22 is connected to the ground potential (low potential-side power supply) Vss.

The comparator CMP1 receives the voltage Va (first voltage) through the input-side negative (−) port and the voltage Vb (second voltage) set on the collector side of the NPN transistor Q1 with the collector connected to the base of the NPN transistor Q1 (a diode with a collector grounded to a base of the diode) through the input-side positive (+) port. The comparator CMP1 compares the voltage Va (first voltage) and the voltage Vb (second voltage) with each other, and outputs the result of the comparison to a node N23 (output side).

The inverter L2 is provided between the node N23 and the NAND circuit L1, and outputs a signal obtained by inverting a voltage Vc at the node N23 to the NAND circuit L1.

The NAND circuit L1 is provided between both the inverter L2 and node N24 (output current detection circuit 2c) and the N-channel MOS transistor NMT12. The NAND circuit L1 performs a logic operation with the signal obtained by inverting the voltage at the node N23 (voltage Vc) and a voltage Vg at the node N24, and outputs the result of the logic operation to a gate of the N-channel MOS transistor NMT12 as a voltage Vd.

A drain of the N-channel MOS transistor NMT11 is connected to the node N21. A gate of the N-channel MOS transistor NMT11 receives the voltage Vc at the node N23. A source of the N-channel MOS transistor NMT11 is connected to the ground potential (low potential-side power supply) Vss.

A drain of the N-channel MOS transistor NMT12 is connected to the node N21. The gate of the N-channel MOS transistor NMT12 receives the voltage Vd (the result of the logic operation by the NAND circuit L1). A source of the N-channel MOS transistor NMT12 is connected to the ground potential (low potential-side power supply) Vss.

When the voltages Vc, Vd are at a high level, the N-channel MOS transistors NMT11, NMT12 are turned on, thereby bringing the node N21 to the level of the ground potential (low potential-side power supply) Vss. In this case, the voltage Va (first voltage) at the node N2 undergoes a resistive division with the resistors R1, R2 and becomes a voltage Va0 (first voltage).

When the voltage Vc shifts from the high level to a low level and the voltage Vd is at the high level, the N-channel MOS transistor NMT11 is turned off and the N-channel MOS transistor NMT12 is turned on, thereby bringing the node N22 to the level of the ground potential (low potential-side power supply) Vss. In this case, the voltage Va (first voltage) at the node N2 undergoes a resistive division with the resistor R1 and (the resistor R2+the resistor R21), and becomes a voltage Va1 (first voltage) higher than the voltage Va0 (first voltage).

When the voltages Vc, Vd shift from the high level to the low level, the N-channel MOS transistors NMT11, NMT12 are turned off. In this case, the voltage Va (first voltage) at the node N2 undergoes a resistive division with the resistor R1 and (the resistor R2+the resistor R21+the resistor R22), and becomes a voltage Va2 (first voltage) higher than the voltage Va1 (first voltage).

The output current detection circuit 2c includes the amplification circuit AMP1, the N-channel MOS transistors NMT1, NMT2, an N-channel MOS transistor NMT13, the P-channel MOS transistors PMT1, PMT2, a P-channel MOS transistor PMT11, the resistors R3 to R7, and resistors R23 to R25.

The output current detection circuit 2c in the embodiment is a circuit obtained by adding the N-channel MOS transistor NMT13, the P-channel MOS transistor PMT11, and the resistors R23 to R25 to the output current detection circuit 2 in the first embodiment.

A drain of the N-channel MOS transistor NMT13 is connected to a node N26. A gate of the N-channel MOS transistor NMT13 is connected to the gates of the N-channel MOS transistors NMT1, NMT2 and the drain of the N-channel MOS transistor NMT2. A source of the N-channel MOS transistor NMT13 is connected to the ground potential (low potential-side power supply) Vss through the resistor R23. The N-channel MOS transistor NMT13 forms a current mirror circuit with the N-channel MOS transistor NMT2, and causes a current I5, which is proportional to the current I4 flowing through the N-channel MOS transistor NMT2, to flow to the ground potential (low potential-side power supply) Vss side.

One end of the resistor R25 is connected to a node N25 (power supply voltage (high potential-side power supply) Vdd). The other end of the resistor R25 is connected to the node N26 (a gate of the P-channel MOS transistor PMT11).

A source of the P-channel MOS transistor PMT11 is connected to the node N25 (power supply voltage (high potential-side power supply) Vdd). A gate of the P-channel MOS transistor PMT11 receives a voltage Ve (the voltage at the node N26). A drain of the P-channel MOS transistor PMT11 is set at the voltage Vg (the voltage at the node N24). The voltage Ve is lower than the power supply voltage (high potential-side power supply) Vdd due to the potential difference generated by the current flowing through the resistor R25. One end of the resistor R24 is connected to the node N24. The other end of the resistor R24 is connected to the ground potential (low potential-side power supply) Vss.

The reference voltage generation circuit 1a, the comparator CMP1, the inverter L2, the NAND circuit L1, the N-channel MOS transistors NMT11, NMT12, the output current detection circuit 2c (specifically, the N-channel MOS transistor NMT13, the P-channel MOS transistor PMT11, and the resistors R23, R24) function as a hysteresis generation circuitry. The hysteresis generation circuitry widens the hysteresis width between the overheat detection temperature and the return temperature when the output current increases (details will be described later).

Figure 12:
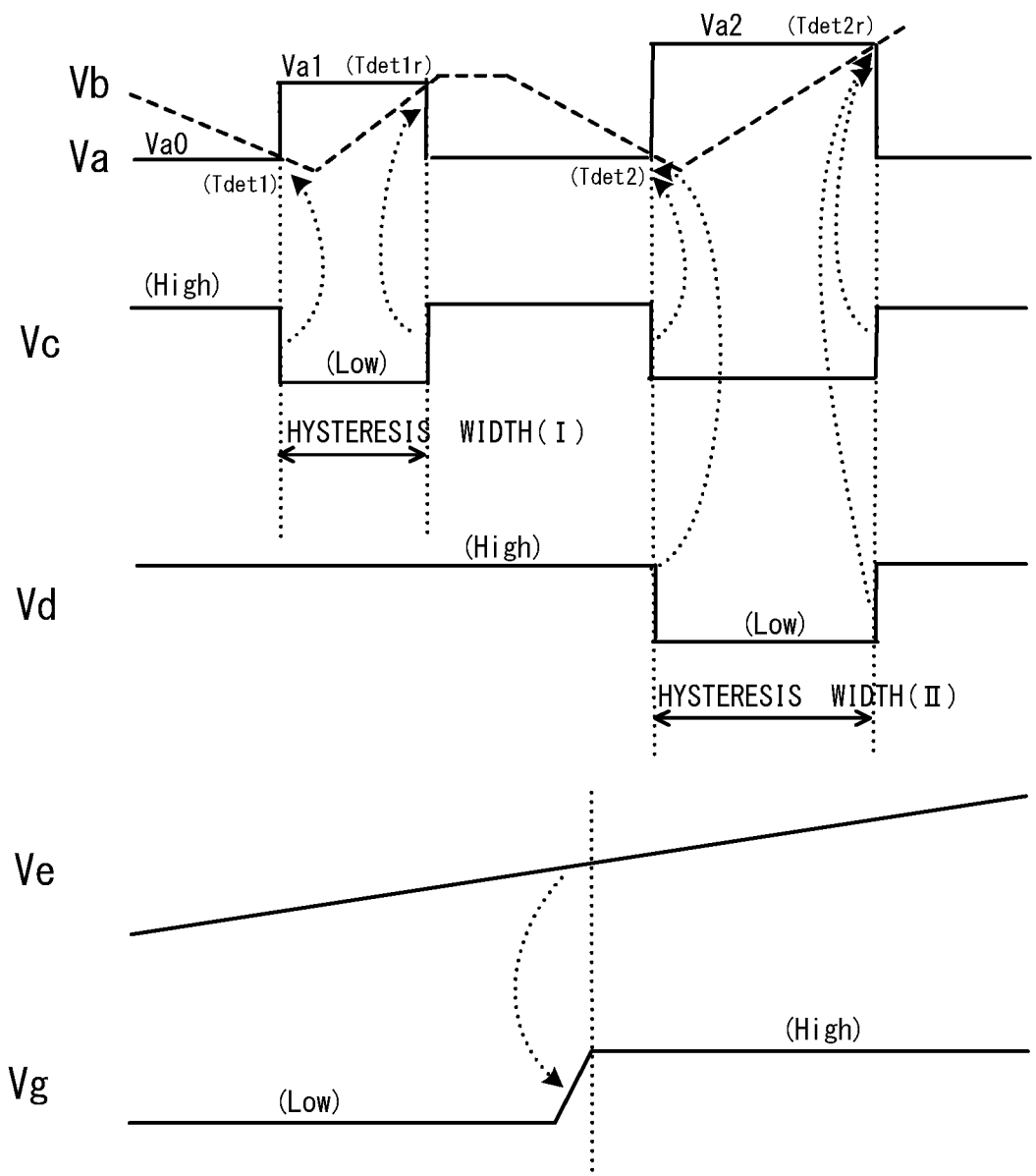
FIG. 12 is a timing chart showing operation of the overheat protection circuit according to the fifth embodiment.

Next, operation of the overheat protection circuit 500 will be described with reference to FIG. 12. FIG. 12 is a timing chart showing the operation of the overheat protection circuit.

As shown in FIG. 12, in a range where the output current Iout1 is relatively small, the voltages Vc, Vd are set at the high level (the N-channel MOS transistors NMT11, NMT12 are turned on), so that the voltage at the node N2 is set at the voltage Va0 (first voltage), which is a constant voltage after a resistive division with the resistors R1, R2. As the output current Iout1 increases and the voltage Vb (second voltage) drops below the voltage Va0 (first voltage), the comparator CMP1 starts performing a blocking operation (outputting a low-level signal). The intersection between the voltage Vb (second voltage) and the voltage Va0 (first voltage) is an overheat detection temperature Tdet1.

At the intersection between the voltage Vb (second voltage) and the voltage Va0 (first voltage), the voltage Vc shifts from the high level to the low level (the N-channel MOS transistor NMT11 is turned of D, and the voltage Vd maintains the high level (the N-channel MOS transistor NMT12 remains turned on). As a result, the voltage at the node N2 is set at the voltage Va1 (first voltage) higher than the voltage Va0 (first voltage), which is a constant voltage after a resistive division with the resistor R1 and (the resistor R2+the resistor R21). The generation of the output current Iout1 is blocked, and the ambient temperature drops. Accordingly, the voltage Vb (second voltage) increases. The comparator CMP1 compares the voltage Vb (second voltage) and the voltage Va1 (first voltage), and starts a return operation (high-level signal) when the voltage Vb (second voltage) exceeds the voltage Va1 (first voltage), so that the output current Iout1 starts flowing. The intersection between the voltage Vb (second voltage) and the voltage Va1 (first voltage) is a return temperature Tdet1r.

Then, as the output current Iout1 becomes relatively large, the voltage Vb (second voltage) drops. When the voltage Vb (second voltage) drops below the voltage Va0 (first voltage), the comparator CMP1 starts performing a blocking operation (outputting the low-level signal). The intersection between the voltage Vb (second voltage) and the voltage Va0 (first voltage) is an overheat detection temperature Tdet2.

Next, at the intersection between the voltage Vb (second voltage) and the voltage Va0 (first voltage), the voltage Vc shifts from the high level to the low level (the N-channel MOS transistor NMT11 is turned off), and the voltage Vd shifts the high level to the low level (the N-channel MOS transistor NMT12 is turned off). As a result, the voltage at the node N2 is set at the voltage Va2 (first voltage) higher than the voltage Va1 (first voltage), which is a constant voltage after a resistive division with the resistor R1 and (the resistor R2+resistor R21+the resistor R22). The generation of the output current Iout1 is blocked, and the ambient temperature drops. Accordingly, the voltage Vb (second voltage) increases. The comparator CMP1 compares the voltage Vb (second voltage) and the voltage Va1 (first voltage), and starts a return operation (high-level signal) when the voltage Vb (second voltage) exceeds the voltage Va2 (first voltage), so that the output current Iout1 starts flowing. The intersection between the voltage Vb (second voltage) and the voltage Va2 (first voltage) is a return temperature Tdet2r.

As the output current Iout1 increases, the potential difference between the source and gate of the P-channel MOS transistor PMT11 (the potential difference between the opposite ends of the resistor R25) increases. As a result, the value of the voltage Ve increases according to the increase in the output current Iout1.

In a range where the output current Iout1 is relatively small, the P-channel MOS transistor PMT11 is turned off, so that the voltage Vg is a low-level signal. As the output current Iout1 increases above a predetermined current value, the P-channel MOS transistor PMT11 is turned on, so that the voltage Vg becomes a high-level signal. When the signal output from the comparator CMP1 is at the low level (blocking signal), a high-level signal from the inverter L2 and a high-level signal from the node N24 (voltage Vg) are input to the NAND circuit L1, and a low-level signal consequently output from the NAND circuit L1 is input to the gate of the N-channel MOS transistor NMT12 as the voltage Vd.

In the embodiment, a hysteresis width II in the case where the output current Iout1 is relatively large can be set to be larger than a hysteresis width I in the case where the output current Iout1 is relatively small.

As described above, the overheat protection circuit 500 in the fifth embodiment is provided with the reference voltage generation circuit 1a, the output current detection circuit 2c, the blocking controller 3, the constant current sources 11, 12, the driver 14, the resistors R8, R9, the NPN transistor Q1, the output MOS transistor PWMT1, the output terminals Pout1, Pout2, the NAND circuit L1, the inverter L2, and the N-channel MOS transistors NMT11, NMT12. The reference voltage generation circuit 1a, the comparator CMP1, the inverter L2, the NAND circuit L1, the N-channel MOS transistors NMT11, NMT12, the output current detection circuit 2c (the N-channel MOS transistor NMT13, the P-channel MOS transistor PMT11, and the resistors R23, R24) function as the hysteresis generation circuitry.

Thus, it is possible to achieve an advantageous effect similar to that of the first embodiment and, additionally, widen the hysteresis width between the overheat detection temperature and the return temperature when the output current increases.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An overheat protection circuit comprising:
   a reference voltage generation circuit configured to generate a first voltage being a constant voltage;
   a constant current source configured to generate a first current being a constant current;
   a second voltage generation circuitry configured to cause a second current to flow to a ground potential side, and generate a second voltage which rises as the second current increases;
   an output current detection circuit configured to generate a third current by subtracting the second current from the first current, and decrease the second current based on the third current as an output current generated by an output circuitry increases, the third current being proportional to the output current; and
   a blocking controller configured to compare the first and second voltages with each other, and generate a blocking control signal to block generation of the output current when the first voltage is higher than the second voltage, wherein:
   an overheat detection temperature drops as the second voltage drops,
   detection of the overheat detection temperature is hastened as the output current increases,
   the output circuitry comprises a first output terminal and a second output terminal,
   the first output terminal provides the output current,
   the second output terminal is connected to the first output terminal through a resistor,
   the output current detection circuit comprises a transistor and a current mirror circuit,
   the transistor is connected to the second output terminal,
   one end of the current mirror circuit is connected to the transistor,
   the other end of the current mirror circuit is connected to the second voltage generation circuitry,
   the current mirror circuit multiplies by a mirror ratio a detector current output to the second output terminal, and
   the current mirror circuit generates the third current from the other end of the current mirror circuit.

2. The overheat protection circuit according to claim 1, wherein the second voltage generation circuitry is an NPN transistor with a collector grounded to a base of the NPN transistor.

3. The overheat protection circuit according to claim 1, wherein the second voltage generation circuitry:
   comprises a first resistor and an NPN transistor with a collector grounded to a base of the NPN transistor, the first resistor and the NPN transistor being connected to each other in series,
   generates the second voltage on one end side of the first resistor, and
   causes the second current to flow to the NPN transistor from another end side of the first resistor.

4. The overheat protection circuit according to claim 1, wherein:
   the blocking controller comprises a comparator and a blocking transistor,
   the comparator receives the first voltage through an input side negative (−) port and the second voltage through an input side positive (+) port, and compares the first and second voltages with each other, and
   the blocking transistor generates the blocking control signal to block generation of the output current based on a signal output from the comparator when the first voltage is higher than the second voltage.

5. The overheat protection circuit according to claim 1, wherein the output circuitry is any one of an output power transistor, an output driver, a high-side switch, a low-side switch, a regulator, a processor, or a CPU.

6. The overheat protection circuit according to claim 1, wherein the reference voltage generation circuit, the constant current source, the second voltage generation circuitry, the output current detection circuit, the blocking controller, and the output circuitry are mounted on a same circuit board or a same semiconductor module.

* * * * *